(12) United States Patent
Chodavarapu et al.

(10) Patent No.: US 11,111,135 B2
(45) Date of Patent: Sep. 7, 2021

(54) METHODS AND DEVICES FOR MICROELECTROMECHANICAL PRESSURE SENSORS

(71) Applicant: MY01 IP Holdings Inc., Montreal (CA)

(72) Inventors: Vamsy Chodavarapu, Brossard (CA); Adel Merdassi, Montreal (CA); Charles Allan, Montreal (CA)

(73) Assignee: MY01 IP Holdings Inc., Montreal (CA)

( * ) Notice: Subject to any disclaimer, the term of this patent is extended or adjusted under 35 U.S.C. 154(b) by 183 days.

(21) Appl. No.: 14/790,225

(22) Filed: Jul. 2, 2015

(65) Prior Publication Data
US 2016/0002026 A1   Jan. 7, 2016

Related U.S. Application Data

(60) Provisional application No. 62/020,049, filed on Jul. 2, 2014.

(51) Int. Cl.
*B81C 1/00* (2006.01)
*H03H 9/24* (2006.01)
(Continued)

(52) U.S. Cl.
CPC .......... *B81C 1/00182* (2013.01); *B81B 7/007* (2013.01); *B81C 1/00269* (2013.01);
(Continued)

(58) Field of Classification Search
CPC .......................... B81C 1/00523–00547; B81C 2201/013–0133; B81C 1/00436–00634; B81B 2201/0264; B81B 3/0021
See application file for complete search history.

(56) References Cited

U.S. PATENT DOCUMENTS 3,590,343 A    6/1971 Nathanson et al.
2005/0076719 A1*  4/2005 Jakobsen ................ B81B 7/007
                                            73/718
(Continued)

FOREIGN PATENT DOCUMENTS

WO    2010003228 A1    1/2010

OTHER PUBLICATIONS

Nabki et al., "A highly integrated 1.8 GHz frequency synthesizer based on a MEMS resonator", IEEE Journal of Solid-State Circuits, Aug. 2009, pp. 2154-2168, vol. 44, No. 8, Institute of Electrical and Electronic Engineers.

(Continued)

*Primary Examiner* — Lauren R Bell

(57) ABSTRACT

MEMS based sensors, particularly capacitive sensors, potentially can address critical considerations for users including accuracy, repeatability, long-term stability, ease of calibration, resistance to chemical and physical contaminants, size, packaging, and cost effectiveness. Accordingly, it would be beneficial to exploit MEMS processes that allow for manufacturability and integration of resonator elements into cavities within the MEMS sensor that are at low pressure allowing high quality factor resonators and absolute pressure sensors to be implemented. Embodiments of the invention provide capacitive sensors and MEMS elements that can be implemented directly above silicon CMOS electronics.

17 Claims, 9 Drawing Sheets

(51) Int. Cl.
| | |
|---|---|
| H03H 3/007 | (2006.01) |
| B81B 7/00 | (2006.01) |
| G01L 9/12 | (2006.01) |
| H03H 9/05 | (2006.01) |
| G01L 9/00 | (2006.01) |
| H03H 9/10 | (2006.01) |

(52) U.S. Cl.
CPC ........ B81C 1/00301 (2013.01); G01L 9/0042 (2013.01); G01L 9/0073 (2013.01); G01L 9/12 (2013.01); H03H 3/0072 (2013.01); H03H 3/0073 (2013.01); H03H 9/0561 (2013.01); H03H 9/1057 (2013.01); H03H 9/2405 (2013.01); H03H 9/2426 (2013.01); H03H 9/2431 (2013.01); H03H 9/2436 (2013.01); *B81B 2203/0307* (2013.01); *H03H 9/2452* (2013.01); *H03H 9/2463* (2013.01); *H03H 9/2473* (2013.01); *H03H 9/2478* (2013.01); *H03H 2009/2442* (2013.01)

(56) References Cited

U.S. PATENT DOCUMENTS

| | | | | |
|---|---|---|---|---|
| 2006/0231521 | A1* | 10/2006 | Chilcott | B81B 3/0072 216/2 |
| 2007/0297631 | A1* | 12/2007 | Miles | H04R 19/04 381/369 |
| 2010/0259130 | A1* | 10/2010 | Eckstein | B81B 3/0021 310/339 |
| 2011/0012248 | A1* | 1/2011 | Reichenbach | B81C 1/00301 257/680 |
| 2013/0210175 | A1* | 8/2013 | Hoisington | B41J 2/14233 438/21 |
| 2014/0125359 | A1 | 5/2014 | El-Gamal et al. | |
| 2014/0374850 | A1* | 12/2014 | Chen | B81B 7/0029 257/415 |
| 2017/0030788 | A1* | 2/2017 | Boysel | B81C 1/00182 |

OTHER PUBLICATIONS

Hopcroft, "Tempertature stabilized silicon resonators for frequency references", Dissertation for the Degree of Doctor of Philosophy, Sep. 2007, Department of Mechanical Engineering, Stanford University, Stanford, California, USA.

Nabki et al., "Low-stress CMOS-compatible silicon carbide surface-micromachining technology—Part I: Process development and characterization", Journal of Microelectromechanical Systems, Jun. 2011, pp. 720-729, vol. 20, No. 3, Institute of Electrical and Electronic Engineers.

Nabki et al., "Low-stress CMOS-compatible silicon carbide surface-micromachining technology—Part II: Beam resonators for MEMS above IC", Journal of Microelectromechanical Systems, Jun. 2011, pp. 730-744, vol. 20, No. 3, Institute of Electrical and Electronic Engineers.

Nguyen, "MEMS technology for timing and frequency control", IEEE Transactions on Ultrasonics, Ferroelectrics, and Frequency Control, Feb. 2007, pp. 251-270, vol. 54, No. 2, Institute of Electrical and Electronic Engineers.

Lam, "A Review of the Recent Development of MEMS and Crystal Oscillators and Their Impacts on the Frequency control Products Industry", IEEE International Ultrasonics Symposium, Nov. 2008, pp. 694-704, Institute of Electrical and Electronic Engineers, Beijing, China.

Wang et al., "VHF free-free beam high-Q micromechanical resonators", Journal of Microelectromechanical Systems, Sep. 2000, pp. 347-360, vol. 9, No. 3, Institute of Electrical and Electronic Engineers.

Renata, "Temperature Insensitive Micromechanical Resonators", Dissertation for the Degree of Doctor of Philosophy, Dec. 2008, Department of Mechanical Engineering, Stanford University, Stanford, California, USA.

Hsu et al., "Stiffness-compensated temperature-insensitive micromechanical resonators," IEEE International conference on Micro Electro Mechanical Systems, Jan. 2002, pp. 731-734, Institute of Electrical and Electronic Engineers.

Ouellet, "MEMS Integrated Design for Inertial Sensors", Webcast Presentation, Jun. 27, 2013, Teledyne DALSA Semiconductor.

Ghaffari et al., "Quantum Limit of Quality Factor in Silicon Micro and Nano Mechanical Resonators," Scientific Reports, Nov. 2013, Article No. 3244, vol. 3, Springer Nature.

Ng et al., "Stable pull-in electrodes for narrow gap actuation", Proceedings of IEEE 27th International Conference on Micro Electra Mechanical Systems (MEMS), Jan. 2014, pp. 1281-1284, Institute of Electrical and Electronic Engineers.

Candler et al., "Long-term and accelerated life testing of a navel single-wafer vacuum encapsulation for MEMS resonators", Journal of Microelectromechanical Systems, Dec. 2008, pp. 1446-1456, vol. 15, No. 6, Institute of Electrical and Electronic Engineers.

Khine et al., "12.9 MHz Lamé-mode differential SOI bulk resonators", The 14th International Conference on Solid State Sensors, Actuators and Microsystems, Jun. 2007, pp. 1753-1756, Institute of Electrical and Electronic Engineers, Lyon, France.

Lee et al., "5.4-MHz single-crystal silicon wine glass mode disk resonator with quality factor of 2 million", Sensors and Actuators A: Physical, Feb. 2009, pp. 28-35, vol. 156, No. 1, Elsevier.

Ng et al., "An Etch Hole-Free Process for Temperature-Compensated High Q, Encapsulated Resonators", Solid-State Sensors, Actuators and Microsystems Workshop, Jun. 2014, pp. 99-100, Hilton Head Island, South Carolina, USA.

Merdassi et al., "Wafer Level Vacuum Encapsulated Capacitive Accelerometer Fabricated in an Unmodified Commercial MEMS Process", Sensors, Mar. 2015, pp. 7349-7359, vol. 15, No. 4, Multidisciplinary Digital Publishing Institute, Basel, Switzerland.

Tu et al., "Study on thermoelastic dissipation in bulk mode resonators with etch holes," IEEE Nano/Micro Engineered and Molecular Systems, Mar. 2012, pp. 478-482, Institute of Electrical and Electronic Engineers, Kyoto, Japan.

Yang et al., "Mechanical coupling of dual breathe-mode ring resonator", IEEE 17th International Conference on Sensors, Actuators and Microsystems, Jun. 2013, pp. 502-505, Institute of Electrical and Electronic Engineers, Barcelona, Spain.

Basu et al., "Microelectromechanical resonators for radio frequency communication applications", Microsystem Technologies, Aug. 2011, pp. 1557-1580, vol. 17, Springer-Verlag.

Kim et al., "Encapsulated MEMS Resonators—A technology path for MEMS into Frequency Control Applications", Plenary Paper Abstract, IEEE International Frequency Control Symposium, Jun. 2010, Institute of Electrical and Electronic Engineers, Newport Beach, California, USA.

* cited by examiner

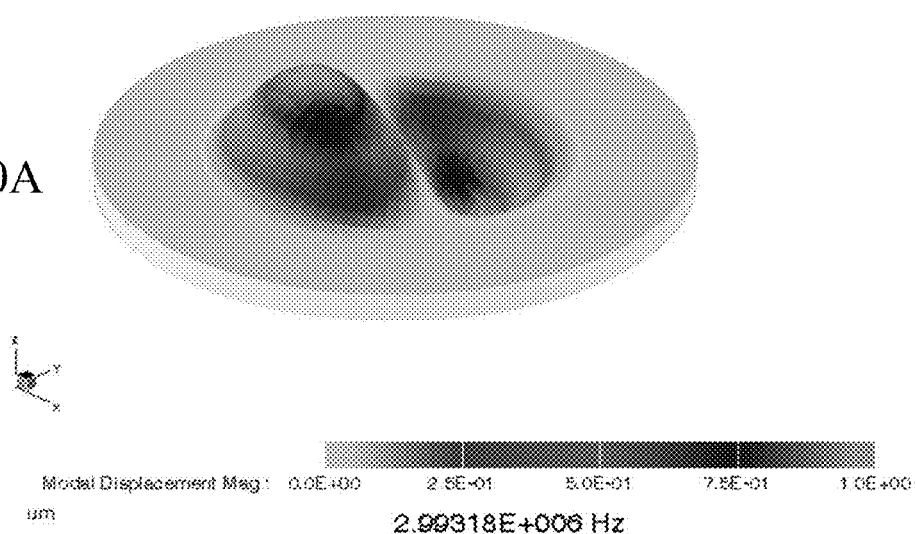
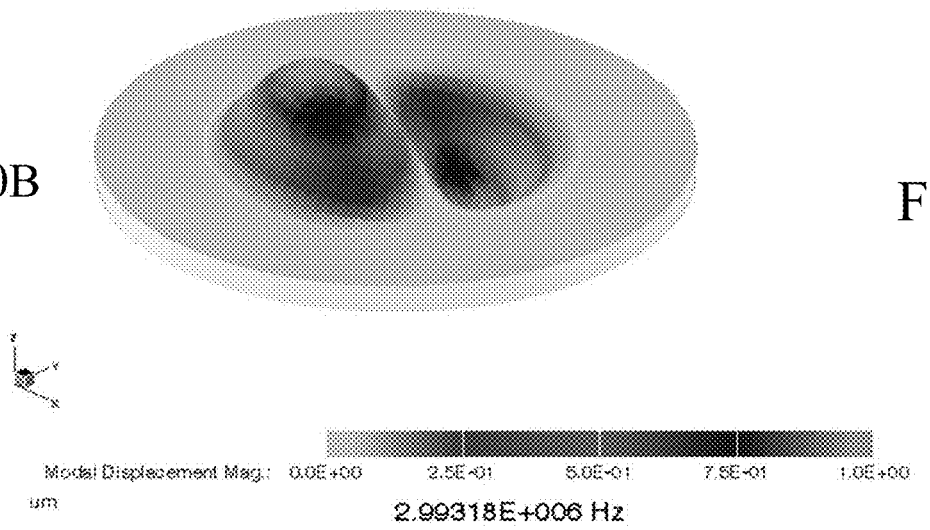
Figure 9
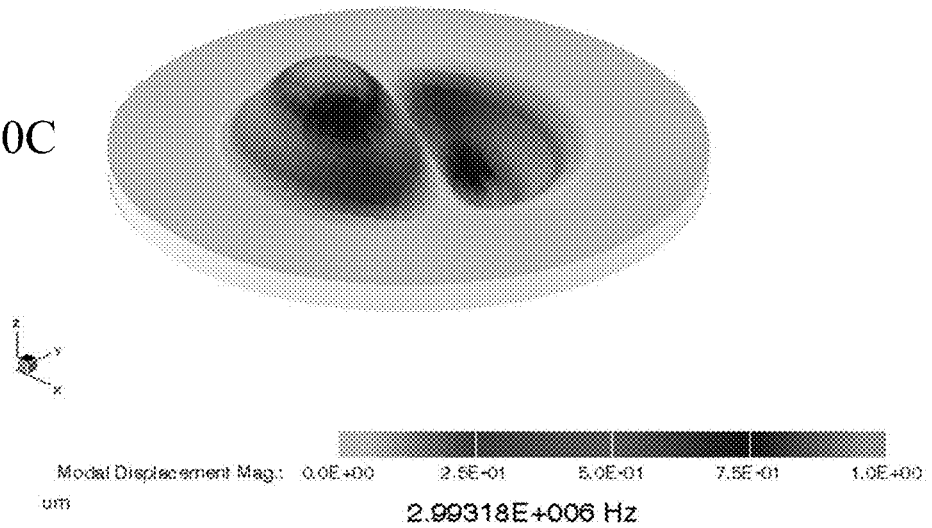

METHODS AND DEVICES FOR MICROELECTROMECHANICAL PRESSURE SENSORS

CROSS-REFERENCE TO RELATED APPLICATIONS

This patent application claims the benefit of U.S. Provisional Patent Application U.S. 62/020,049 filed Jul. 2, 2014 entitled "Methods and Devices for Microelectromechanical Sensors", the entire contents of which are included by reference.

FIELD OF THE INVENTION

The present invention relates to MEMS sensors and more particularly to absolute pressure MEMS capacitive sensors which may be manufactured directly over or in conjunction with silicon based CMOS electronics.

BACKGROUND OF THE INVENTION

Microelectromechanical systems (MEMS) are small integrated devices or systems that combine electrical and mechanical components. The components can range in size from the sub-micrometer level to the millimeter level, and there can be any number, from one, to few, to potentially thousands or millions, in a particular system. Historically MEMS devices have leveraged and extended the fabrication techniques developed for the silicon integrated circuit industry, namely lithography, doping, deposition, etching, etc. to add mechanical elements such as beams, gears, diaphragms, and springs to silicon circuits either as discrete devices or in combination with integrated silicon electronics. Whilst the majority of development work has focused on silicon (Si) electronics additional benefits may be derived from integrating MEMS devices onto other existing electronics platforms such as silicon germanium (SiGe), gallium arsenide (GaAs) and, indium phosphide (InP) for RF circuits and future potential electronics platforms such as organic based electronics, nanocrystals, etc.

Examples of MEMS device application today include inkjet-printer cartridges, accelerometers, miniature robots, micro-engines, locks, inertial sensors, micro-drives, micromirrors, micro actuators, optical scanners, fluid pumps, transducers, chemical sensors, pressure sensors, and flow sensors. New applications are emerging as the existing technology is applied to the miniaturization and integration of conventional devices. These systems can sense, control, and activate mechanical processes on the micro scale, and function individually or in arrays to generate effects on the macro scale. The micro fabrication technology enables fabrication of large arrays of devices, which individually perform simple tasks, or in combination can accomplish complicated functions.

MEMS have become a successful sensing and actuating technology. Because of their extensive optical, electrical to mechanical functionalities, MEMS devices are suited to applications in many different fields of science and engineering. However, because of this vast range of functionality, MEMS fabrication processes, unlike the microelectronics industry, are difficult to gear towards general applications. As a result most processes are aimed at the fabrication of a few devices, and usually performance of the devices is hindered by process variability. As MEMS devices are typically sensing weak analog signals, for example pressure, acceleration, vibration, magnetic or electric fields, with capacitive based elements, there is considerable benefit in being able to integrate analog front-end electronics to buffer, amplify and process these weak electronic signals and either facilitate their direct processing, such as with RF signals, or their digitization for sensing and measurements applications.

MEMS sensors, like other sensors, are transducers or converters that measure a physical quantity and convert it into a signal which can be read. Typically, that reading is by an electronic instrument which converts the signal to a measurement based upon the sensitivity of the sensor, its calibration data, and other corrections. Included within the many types of sensors are those relating to sound, acoustics, vibration, chemicals, humidity, pressure, fluid flow, position, displacement, force, level, temperature, proximity, and acceleration. For each type of sensor, different sensing mechanisms exist which may for example be targeted to different dynamic ranges, speed, accuracy, etc. Amongst these capacitive sensing constitutes a very important means of monitoring many environmental conditions in an effective and reliable manner as well as having applications in areas including, but not limited to, gas sensing, thickness measurements, haptic interfaces, heating, ventilation, and air conditioning system monitoring, and displacement measurements. Accordingly, capacitive sensors have major applications in the consumer, industrial, automotive and medical fields. One such capacitive sensor being pressure.

Capacitive based pressure sensors are based upon the variation of capacitance arising from pressure induced membrane displacement where the membrane represents one of the two electrodes constituting the electrical capacitor. However, whilst easily deployed for relative pressure measurements the implementation of absolute pressure sensors has within the prior art caused significant issues due to the issues of providing a reference pressure and/or reference pressure element through sealing. Accordingly, it would be beneficial to provide a capacitance based pressure sensor realized with a high vacuum cavity without requiring a sealing technique. It would be further beneficial for the capacitance based pressure sensor to provide increased reproducibility through thickness control of the layer(s) within the sensor forming the mechanical membrane.

However, in essentially all applications, the important considerations for selecting a MEMS sensor include:
  Accuracy;
  Repeatability;
  Long-term stability;
  Ease of calibration;
  Size;
  Packaging; and
  Cost effectiveness.

MEMS sensors require electronic circuits to either provide excitation and/or bias signals, as in the instance of MEMS resonators, or to convert the MEMS sensor output to a signal for use by other electronics. Silicon CMOS electronics has become the predominant technology in analog and digital integrated circuits. This is essentially because of the unparalleled benefits available from CMOS in the areas of circuit size, operating speed, energy efficiency and manufacturing costs which continue to improve from the geometric downsizing that comes with every new generation of semiconductor manufacturing processes. In respect of MEMS systems, CMOS is particularly suited as digital and analog circuit can be designed in CMOS technologies with very low power consumption. This is due, on the digital side, to the fact that CMOS digital gates dissipate power predominantly during operation and have very low static power consumption. This power consumption arising from the charging and discharging of various load capacitances within the CMOS gates, mostly gate and wire capacitance, but also transistor drain and transistor source capacitances, whenever they are switched. On the analog side, CMOS processes also offers power savings by offering viable operation with sub-1V power supplies and with µA-scale bias currents.

Accordingly, it would be beneficial whilst designing MEMS resonators and absolute pressure sensors it would be beneficial to establish their designs such that they are compatible with combining the CMOS and MEMS technologies into a single integrated circuit. It would be further beneficial for the processes of manufacturing MEMS resonators and absolute pressure sensors to support the integration of other capacitive sensors for other measurands within a single die and for the MEMS elements to be implemented directly atop silicon CMOS electronics (i.e. above integrated circuits, or above-IC) thereby minimizing footprint, cost, and parasitics.

Other aspects and features of the present invention will become apparent to those ordinarily skilled in the art upon review of the following description of specific embodiments of the invention in conjunction with the accompanying figures.

SUMMARY OF THE INVENTION

It is an object of the present invention to mitigate limitations within the prior art relating to MEMS sensors and more particularly to absolute pressure MEMS capacitive sensors which may be manufactured directly over or in conjunction with silicon based CMOS electronics.

In accordance with an embodiment of the invention there is provided a MEMS device comprising three layers: a bottom handling layer, a middle device layer, and a top layer. A trench formed in the top layer prior to adhesion to the device layer creates a cavity between the top layer and device layer. A through-hole opening formed in the handling layer exposes the bottom face of the device layer to the ambient pressure environment. The device layer forms the pressure-sensitive membrane of the capacitor.

In accordance with an embodiment of the invention there is provided a MEMS device comprising:
a plurality of first sensors, each first sensor comprising
 a first membrane of a first predetermined thickness formed within a device layer;
 an upper cavity formed between a top layer and the device layer; and
 an opening formed within a handling layer; and
a plurality of second sensors, each second sensor comprising:
 a second membrane of a second predetermined thickness formed within the device layer;
 an upper cavity formed between the top layer and the device layer; and
 an opening formed within the handling layer; wherein
the plurality of first sensors and the plurality of second sensors are concurrently formed and represent a plurality of first pressure sensors and a plurality of second pressure sensors respectively.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIG. 9 depicts modal analysis of a MEMS absolute pressure sensor according to an embodiment of the invention;

DETAILED DESCRIPTION

The present invention is directed to MEMS sensors and more particularly to absolute pressure MEMS capacitive sensors which may be manufactured directly over or in conjunction with silicon based CMOS electronics.

The ensuing description provides exemplary embodiment(s) only, and is not intended to limit the scope, applicability or configuration of the disclosure. Rather, the ensuing description of the exemplary embodiment(s) will provide those skilled in the art with an enabling description for implementing an exemplary embodiment. It being understood that various changes may be made in the function and arrangement of elements without departing form the spirit and scope as set forth in the appended claims.

A. Pressure Sensor

Miniaturized pressure sensors are among the most mass-produced MEMS devices in the recent years and find its applications in different areas including automotive, and aerospace, energy and biomedical application. As discussed supra it would be beneficial to realize a capacitive sensor constituting of a high vacuum cavity without any post-fabrication sealing requirements providing an absolute pressure sensor with improved manufacturing yields whilst controlling the membrane thickness forming the mechanical test specimen. Accordingly, embodiments of the invention exploit both bulk micromachining and surface micromachining in order to provide a MEMS pressure sensor offering:

Effective control of the membrane thickness and consequently a predictable response of the theoretical calculations;

Good encapsulation of the cavity without any need to create holes to allow for the sealing technique;

Small gap between the two electrodes, which increases the DC capacitance value, and consequently the sensor sensitivity. The small gap is precise and well controlled by means of spacer layer; and Higher vacuum in the cavity increasing hence the quality factor Q, the frequency range of the measurement for dynamic measurement and ultimately the reliability of the sensor.

A1. Theoretical Analysis

Figure 1:
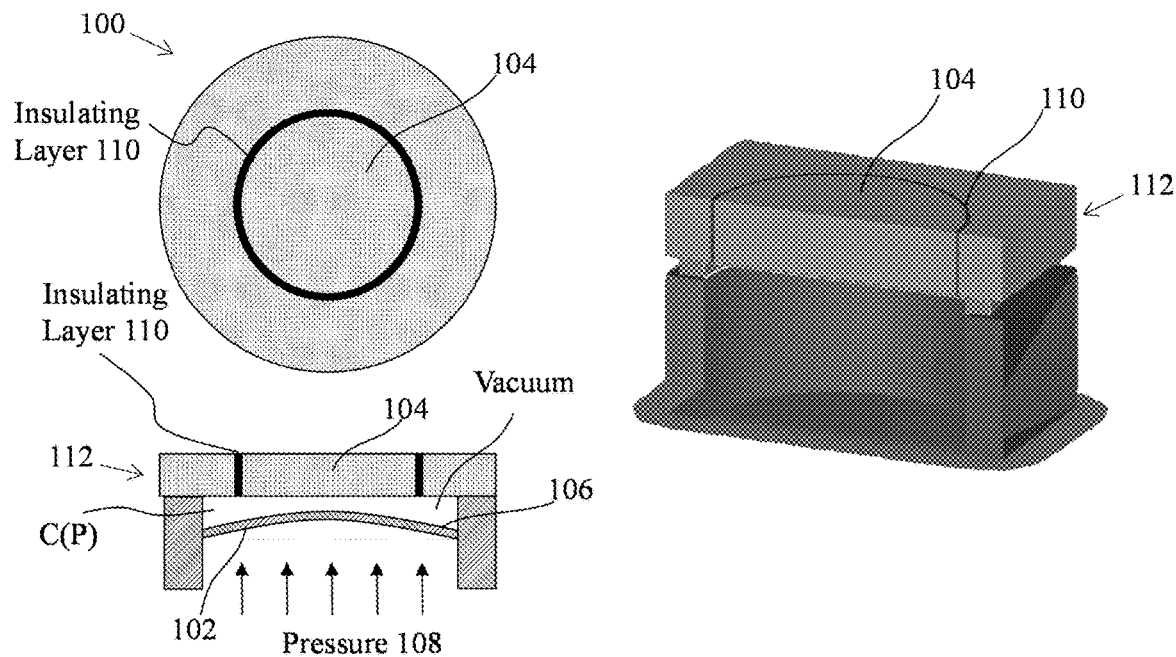
FIG. 1 depicts a MEMS absolute pressure sensor according to an embodiment of the invention.
Figure 2:
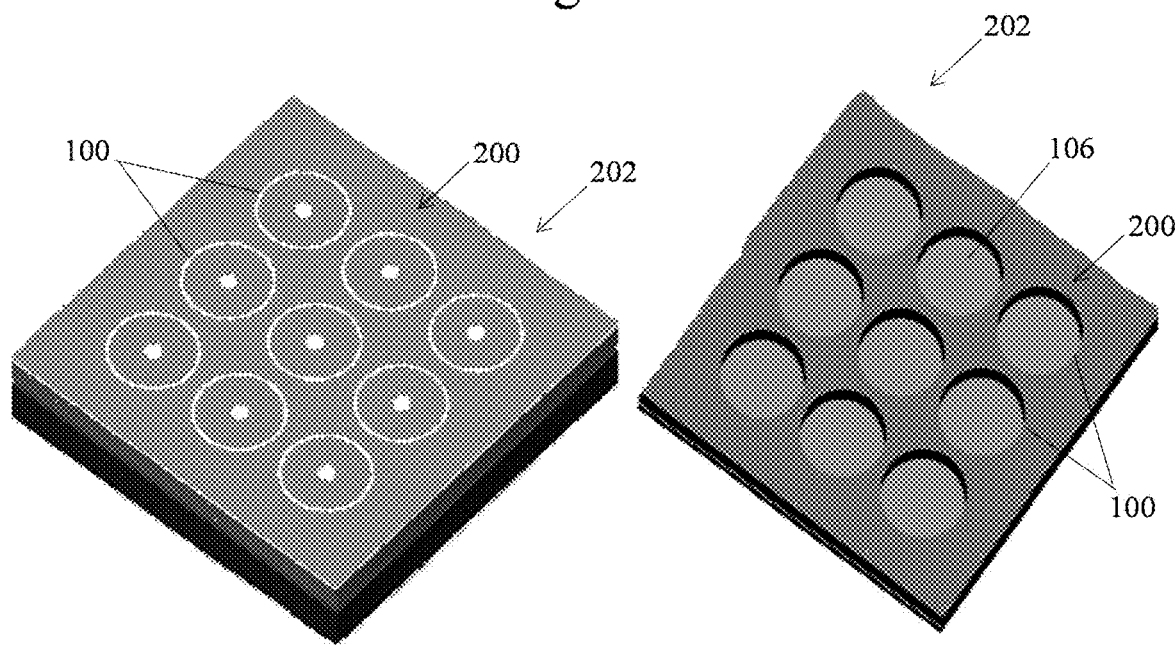
FIG. 2 depicts an array of MEMS absolute pressure sensors according to an embodiment of the invention.

A1.A Static Modeling: The design of the MEMS capacitor pressure sensor 100 is based on two electrodes 102, 104 forming an electrical capacitor. As depicted in FIG. 1, the bottom electrode 102 comprises a circular membrane 106 experiencing a distributed pressure load 108. If the pressure within the cavity formed between 106 and the top cap 112 is close to vacuum, the capacitor allows for an absolute rather than relative pressure measurement. The annular ring of insulating material 110 serves to provide electrical isolation between the top electrode 104 and the bottom electrode 102. As depicted in FIG. 2, an array 200 of capacitance-based pressure sensors 100 may be implanted with a single sensor die 202, increasing both the magnitude of the capacitance and the pressure-induced capacitance variation.

Figure 3A:
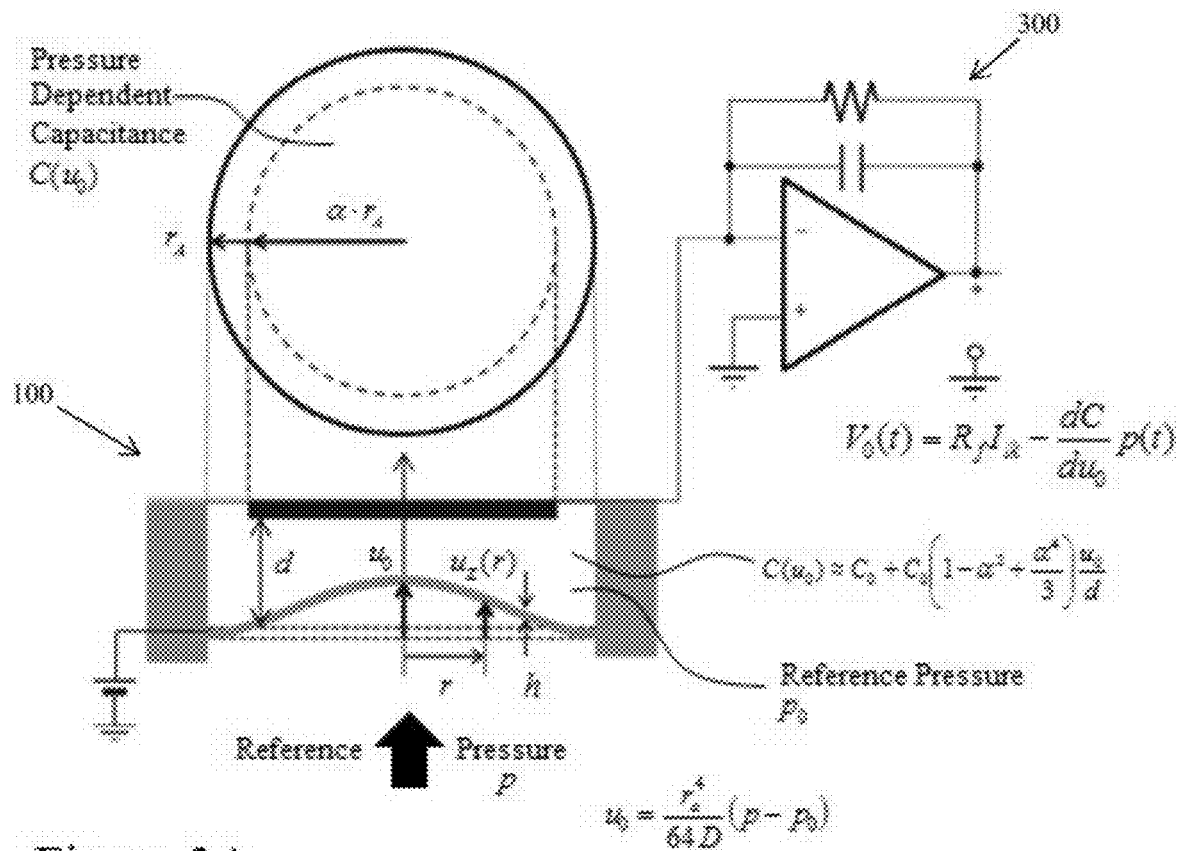
FIG. 3A depicts schematically the MEMS absolute pressure sensor according to an embodiment of the invention acting as a capacitive transducer in conjunction with an Op-Amp based capacitance to voltage converter and it's equivalent circuit in FIG. 3B.
Figure 3B:
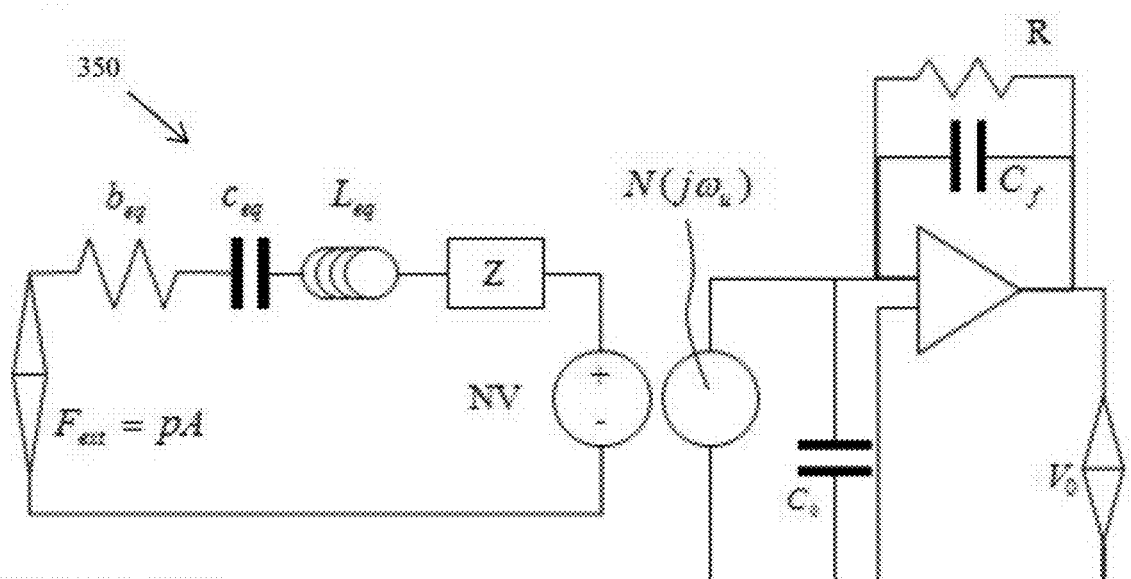

Referring to FIG. 3A the capacitive MEMS pressure sensor 100 is depicted coupled to an operational amplifier 300 (Op-Amp) based capacitance to voltage converter. The equivalent circuit 350 for such a combination being depicted in FIG. 3B wherein the output voltage is given by Equations (1A) to (1C).

$$V_{OUT} = i(R_f / C_f) = \left(N\dot{x} + \frac{v}{(1/j\omega C_0)}\right)(R_f / C_f) \quad (1A)$$

$$= N\dot{x}(R_f / C_f) \quad (1B)$$

$$= V_{IN} \frac{\delta C}{\delta u} \dot{u}(R_f / C_f)$$

$$= V_{IN} \frac{\delta C}{\delta u} \dot{u}_0(R_f / C_f)$$

$$= V_{IN} \frac{\delta C}{\delta u_0} \frac{r_a^4}{64D} p_0(R_f / C_f) \quad (1C)$$

A1.B Dynamic Modeling: The dynamic modeling takes into account the dynamic measurement of the pressure in order to deduce the frequency range over which the sensor 100 can sustain its metrology specifications. In this context the objective is to identify the mechanical impedance i.e. the equivalent spring coefficient constant. $k_{eq}$, equivalent mass, $m_{eq}$, and damping coefficient, $b_{eq}$. If we consider $p(t) = p_m \sin(\omega t) - p_0 \Rightarrow \dot{p} = p_m \omega \cos(\omega t)$ then the output voltage defined in Equation (6C) can be re-written as Equations (2A) and (2B).

$$V_{OUT} = V_{IN} \frac{\delta C}{\delta u_0} \frac{r_a^4}{64D} \frac{R_f}{\sqrt{1 + (\omega R_f c_f)^2}} p_m \omega \cos\left(\omega t + \arctg\left(\frac{1}{\omega R_f c_f}\right)\right) \quad (2A)$$

-continued $$= \frac{V_{IN}}{C_f} \frac{\delta C}{\delta u_0} \frac{r_a^4}{64D} \frac{\omega R_f C_f}{\sqrt{1 + (\omega R_f c_f)^2}} p_m \cos\left(\omega t + \arctg\left(\frac{1}{\omega R_f c_f}\right)\right) \quad (2B)$$

With respect to damping coefficient expression then based upon the Reynold's equation $$\Delta P = \frac{12\eta}{h^3} \frac{\delta h}{\delta t}$$

where $\eta$ is the dynamic viscosity. In cylindrical coordinates, we get Equation (3). As a result the mechanical impedance can be expressed by its basic parameters as given by Equations (4A) to (4C) respectively.

$$\frac{1}{r} \frac{\delta}{\delta r}\left(r \frac{\delta P}{\delta r}\right) = \frac{12\eta}{h^3} \frac{dh}{dt} \Rightarrow F_d = -\frac{3\pi n}{2h^3} a^4 \frac{dh}{dt} \quad (3)$$

$$k_{eq} = \frac{16}{3} \frac{Eh^3}{1-v^2} \frac{\pi}{r_a^2} \quad (4A)$$

$$m_{eq} = \frac{256}{316} \rho \pi r_a^2 h \quad (4B)$$

$$b_{eq} = \frac{3}{2} \frac{\pi}{d^3} \eta r_a^4 \quad (4C)$$

A1.C Sensor Sensitivities: Based upon the expression of the capacitance in terms of the applied pressure then it is possible to deduce the expression of the electrical signal in terms of pressure as described by Equation (5).

$$S_{C/P} = S_{mec} S_{elec} = \frac{\delta C}{\delta x} \frac{\delta x}{\delta P} = \frac{\delta C}{\delta x} \frac{\delta u_0}{\delta P} \quad (5)$$

Accordingly, the capacitance of the MEMS sensor 100 is given by Equation (6) wherein if we subsequently let $$X = \left(1 - \left(\frac{r}{R}\right)^2\right) \Rightarrow dX = 2\frac{r}{R^2} dr$$

we derive Equations (7). Then letting $$x = \sqrt{\frac{u_0}{d}} X$$

we derive Equation (8).

$$C = \int_0^{\alpha R} \frac{\varepsilon_0 2\pi r}{d - u(r)} dr = \int_0^{\alpha R} \frac{\varepsilon_0 2\pi r}{d - u_0\left(1 - \left(\frac{r}{R}\right)^2\right)} dr \quad (6)$$

$$\Rightarrow C = \int_{1-\alpha^2}^{1} \frac{\varepsilon_0 \pi R^2}{d\left(1 - \left(\frac{u_0}{d}\right) X^2\right)} dr \quad (7)$$

$$\Rightarrow C = \frac{\varepsilon_0 \pi R^2}{d\sqrt{\frac{u_0}{d}}} \int_{\sqrt{\frac{u_0}{d}(1-\alpha^2)}}^{\sqrt{\frac{u_0}{d}}} \frac{1}{(1-x^2)} = \frac{C_0}{2\sqrt{\frac{u_0}{d}}} [\arg thx]_{\sqrt{\frac{u_0}{d}(1-\alpha^2)}}^{\sqrt{\frac{u_0}{d}}} \quad (8)$$

Accordingly, solving this we derive Equations (9A) and (9B) which yields Equations (10) and (11) and hence the sensitivity is defined by Equations (12) and (13).

$$C = \frac{C_0}{2\sqrt{\frac{u_0}{d}}} \mathrm{Ln}\left(\frac{\left(1+\sqrt{\frac{u_0}{d}}\right)\left(1-(1-\alpha^2)\sqrt{\frac{u_0}{d}}\right)}{\left(1-\sqrt{\frac{u_0}{d}}\right)\left(1-+(1-\alpha^2)\sqrt{\frac{u_0}{d}}\right)}\right) \quad (9A)$$

$$C = \frac{C_0}{2\alpha\sqrt{\frac{u_0}{d}}} \mathrm{Ln}\left(\frac{\left(1+\alpha^2\sqrt{\frac{u_0}{d}} + \alpha^2\frac{u_0}{d} - \frac{u_0}{d}\right)}{\left(1-\frac{u_0}{d} + \alpha^2\frac{u_0}{d} - \alpha^2\sqrt{\frac{u_0}{d}}\right)}\right) \quad (9B)$$

$$C = C_0\left(1 + \left(1 - \alpha^2 + \frac{\alpha^4}{3}\right)\frac{u_0}{d} + \left(1 - \alpha^2 + 2\alpha^4 - \frac{\alpha^8}{5}\right)\left(\frac{u_0}{d}\right)^2\right) \quad (10)$$

$$S_{C/P} = C_0\left(1 - \alpha^2 + \frac{\alpha^4}{3}\right)\frac{1}{d}\frac{R^4}{64D} = C_0 K \frac{1}{d}\frac{R^4}{64D} \text{ with } K = \frac{1}{3} \quad (11)$$

$$S_{V/P} = \frac{\delta V_{out}}{\delta P} \quad (12)$$

$$= \left|N\right|_{u_0=0} \frac{\dot{u}_0}{P}(R_f/C_f)\bigg|$$

$$= C_0\left(\frac{V_{in}}{d}\right) \frac{\pi r_a^2 \frac{1}{C_f \omega}}{\frac{K_e}{\omega}\sqrt{\left(1 + \left(\frac{\omega}{\omega_0}\right)^2\right) + \left(2\xi\frac{\omega}{\omega_0}\right)^2 + Z_m'}}$$

$$S_{V/P} = C_0\left(\frac{V_{in}}{d}\right)\frac{\pi r_a^2 \frac{1}{C_f \omega}}{\frac{K_e}{\omega}} = \frac{C_0}{C_f}\left(\frac{V_{in}}{d}\right)\frac{\pi r_a^2}{64D\frac{\pi}{r_a^2}} = \frac{C_0}{C_f}\left(\frac{V_{in}}{d}\right)\frac{\pi r_a^4}{64D} \quad (13)$$

A2. Design.

Figure 4:
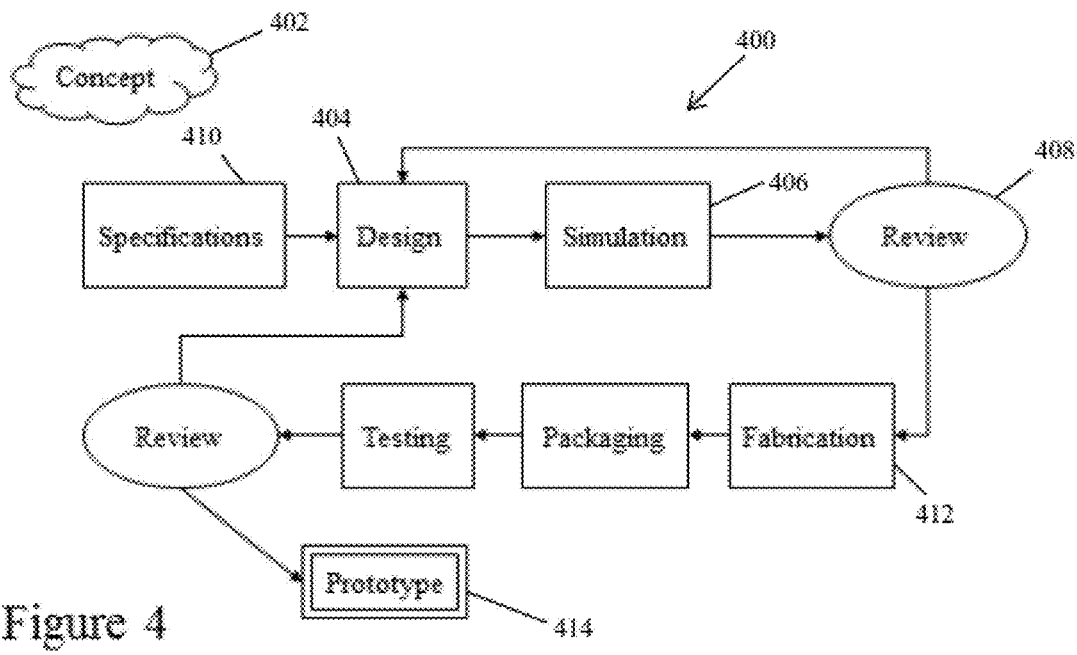
FIG. 4 depicts the development methodology for establishing MEMS devices according to embodiments of the invention.

The methodology 400 adopted by the inventors was based on a common prototyping methodology for MEMS sensors, which as depicted in FIG. 4, involves the usual steps from the initial concept 402 through to the prototype 414 including steps of design 404, electromechanical simulation 406 (using Coventorware CAD software), verifying the sensor characteristics 408 that fit well the desired metrology specifications 410, fabrication 412, post-processing and finally sensor calibration. The center of the sensor membrane 106 has a displacement that is directly proportional to the pressure load 108. This deformation is then converted into electrical capacitance which will be linearized in order to get a linear relationship between the pressure measurement and the output voltage.

Figure 5:
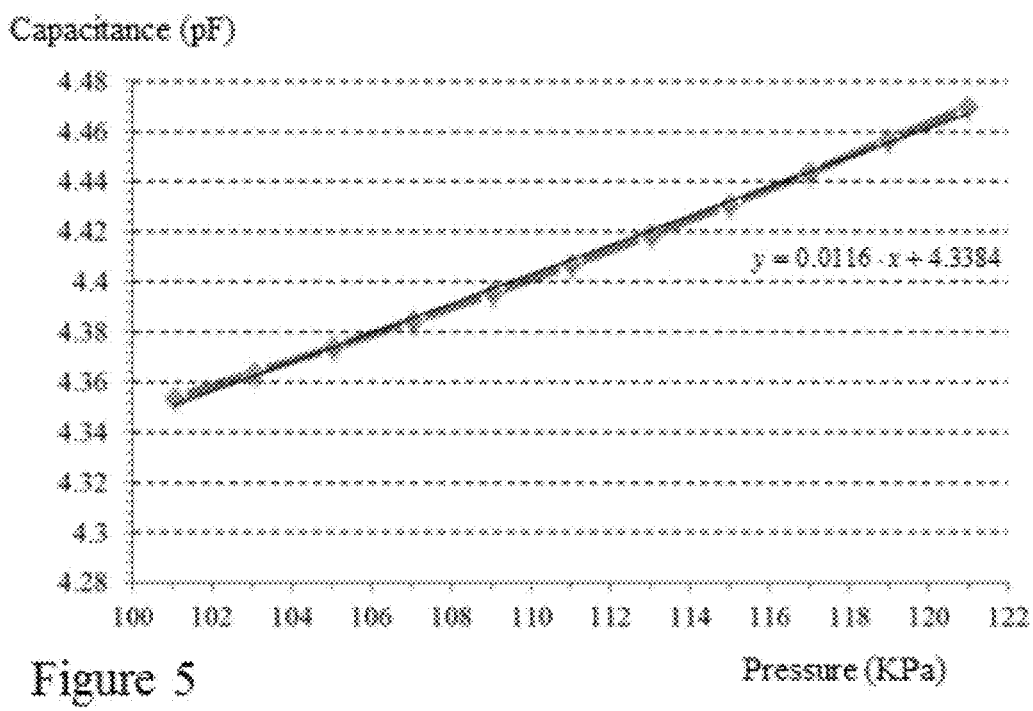
FIG. 5 depicts the calibration curve for a MEMS absolute pressure sensors according to an embodiment of the invention.

In order to obtain a linear relationship the inventors only use the first order expansion of Equation (10) where $u_0$ is proportional to the applied pressure. $C_0$ is the capacitance of the un-deformed membrane 106 and is given by $$C_0 = \frac{\varepsilon_0(\alpha R)^2 \pi}{d}$$

and α is the dimensionless parameter controlling the effective radius of the upper electrode 104 and its choice depends on the fabrication design rules check (DRC). Preliminary simulation results were deduced and a depicted in FIG. 5 over a range of pressures from 1 atmosphere (approximately 101 kPa) to 120 kPa where good linearity can be seen.

Within the modelling and design iteration process the ratio of $u_0/d \ll 1$. This leads to Equations (14) and (15). Through the design process the inventors choose the lowest d and for each couple (R, h) chose designs that fit with the required specification of δp. In order to calculate the couple (R, h) the mechanical sensitivity is fixed by setting $S_{mec} = U_{max}/P_{max}$, then the value of R is fixed, which in turn is dependent upon the available die area. The resulting value of h is calculated using Equation (16).

$$S_{C/P} = \frac{C_0}{3d}\frac{R^4 12(1-v^2)}{64Eh^3} = \frac{\varepsilon_0 \pi 12(1-v^2)}{192Ed^2}\frac{R^6}{h^3} \quad (14)$$

$$\delta p = \frac{\delta C}{S_{C/P}} = \delta C\left(\frac{192Ed^2}{\varepsilon \pi 12(1-v^2)}\frac{h^3}{R^6}\right) \quad (15)$$

$$S_{mec} = \frac{12(1-v^2)}{64E}\frac{R^4}{h^3} \Rightarrow h = \sqrt[3]{\frac{12(1-v^2)R^4}{64ES_{mec}}} \quad (16)$$

Subsequently, for each set of (R, h), the ratio is checked to verify that the circular membrane 106 can be considered a membrane. Finally, it is verified that the design meets the required pressure resolution specification.

A3. Fabrication

Figure 6:
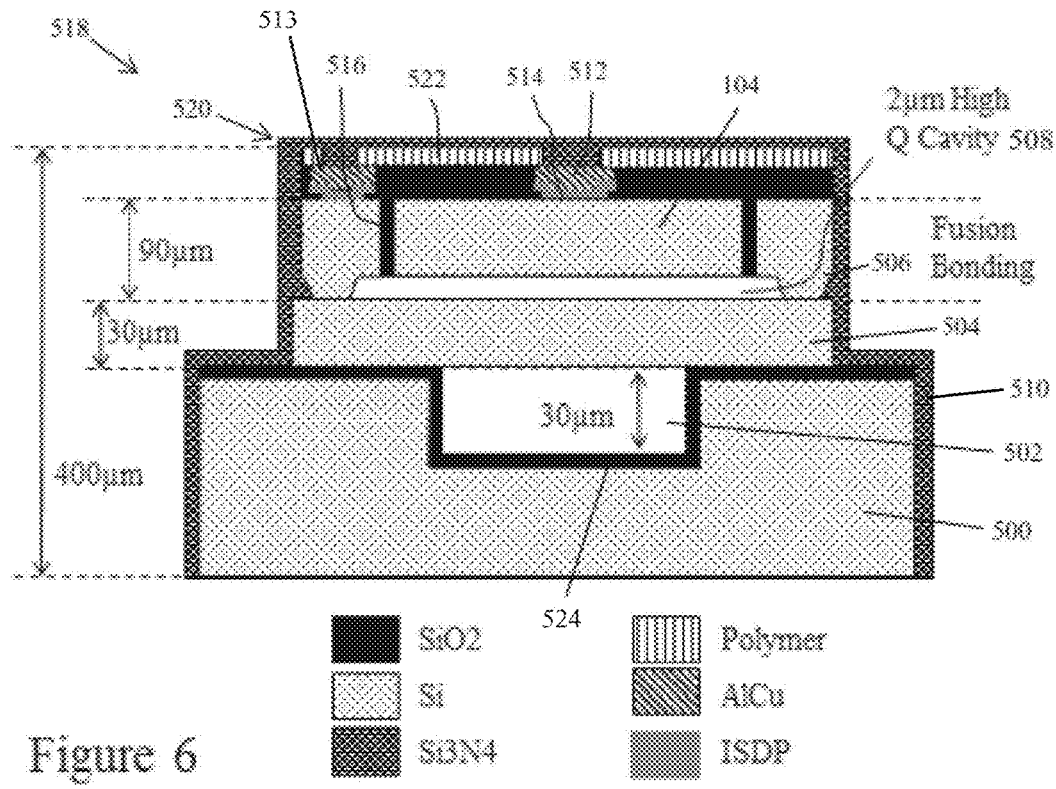
FIG. 6 depicts a MEMS absolute pressure sensor according to an embodiment of the invention after formation of the absolute pressure side of the sensor and deposition of the protective coating for post-processing.
Figure 7A:
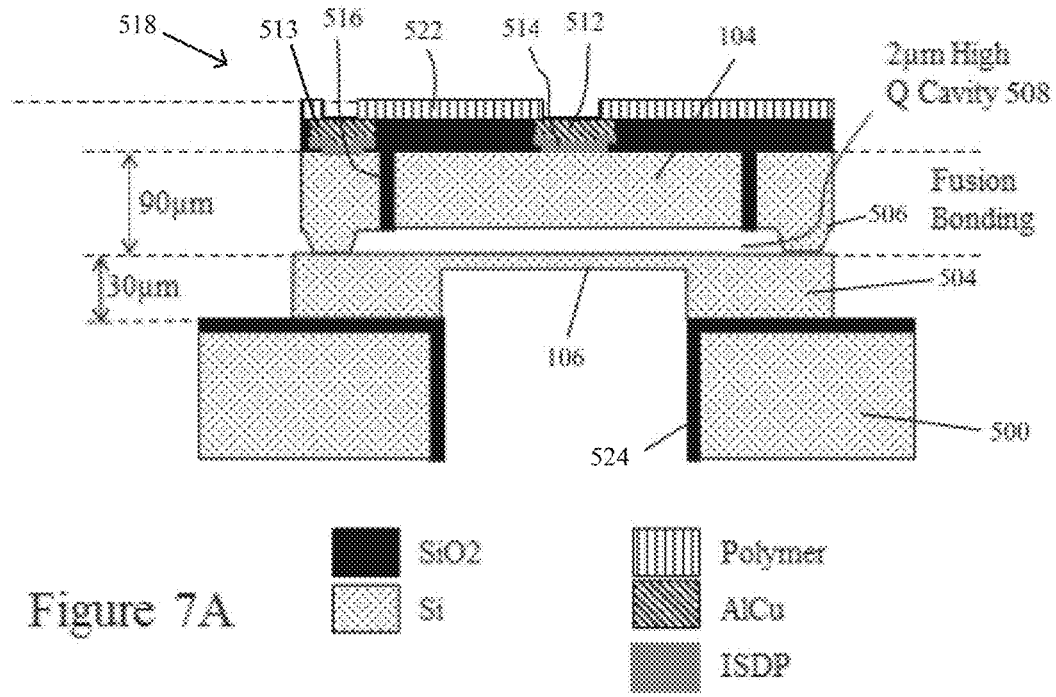
FIGS. 7A and 7B depict the MEMS absolute pressure sensor according to an embodiment of the invention after deep etching of the handling wafer to expose the device layer and etching of the device layer to form the sensor membrane respectively.
Figure 7B:
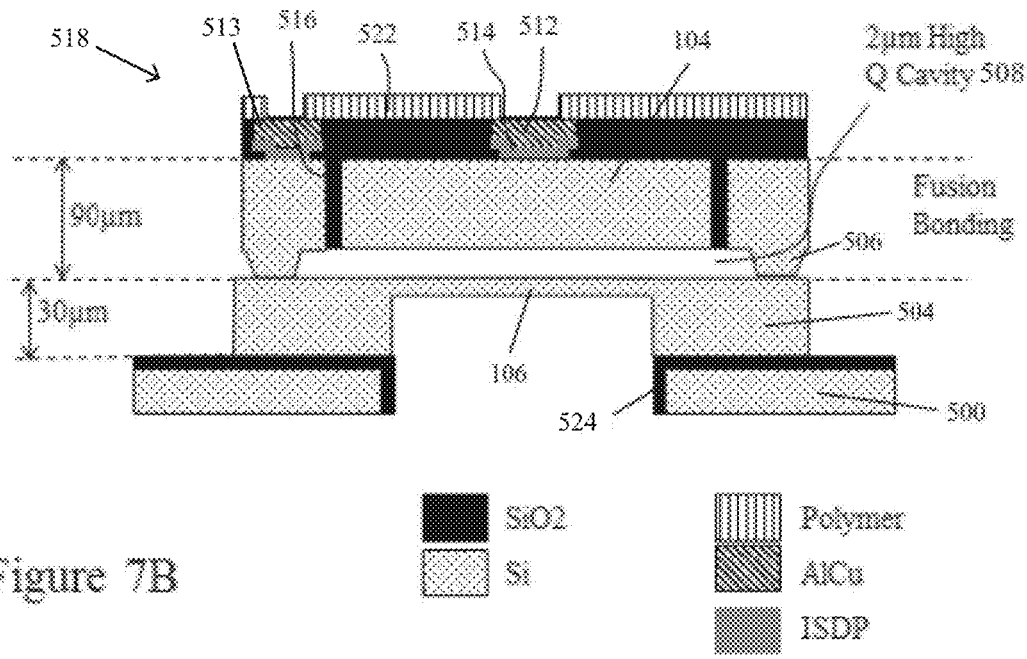

A3.A Design Cross-Section. FIGS. 6, 7A, and 7B show the MEMS pressure sensor at different stages of post-fabrication processing wherein the capacitor membrane 106 is defined. Referring to FIG. 6, the sensor includes three silicon wafers that are bonded together: a bottom handling layer 500, a device layer 504, and a top layer 506. The two electrodes that define the capacitor are (i) the silicon disc 104 in the top layer 506, and (ii) the rest of the top layer 506 and the device layer 504 that are electrically isolated from the disc 104. The membrane 106 and top electrode 104 are separated by the 2 μm cavity 508. Electrical contacts 512, 513 established on the top surface of the top layer 506 allow for electrical connections to the capacitor electrodes-namely the top electrode 104 and the membrane 106.

Figure 10:
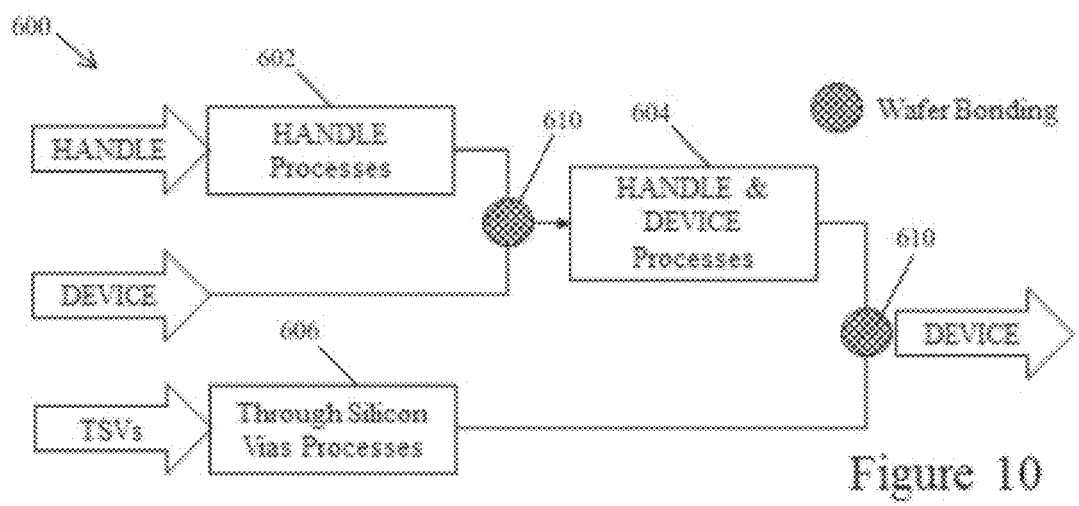
FIG. 10 depicts a process flow for fabricating MEMS capacitors according to embodiments of the invention.

FIG. 6 shows the device 518 after wafer-wafer bonding of the three silicon wafers 500, 504, and 506. Prior to bonding, each of the three layers undergoes fabrication steps to define features. FIG. 10 shows an exemplary process flow 600 wherein three sub-process flows 602, 604, and 606 are applied to the handling wafer 500, device wafer 504, and top wafer 506.

Sub-process 602 on the handling wafer 500 includes forming of a 30 μm trench 502 and coating of the top surface with insulating $SiO_2$ 510. Subsequently, the handling wafer 500 is bonded to the device wafer 504, which is typically 30 μm thick.

Sub-process 604 involves additional combined handling and device wafer processing.

In the third sub-process 606, TSVs are implemented as required in the top layer which is then bonded to the handling and device wafer combination.

In the third sub-process 606, the top layer 506 is fabricated using TSV processes, and a 2 μm trench is etched in the bottom surface of the top layer 506.

The upper contacts 512, 513 are defined on the top layer 506 as depicted in FIG. 6. The contacts are aluminum copper (AlCu) with an underlying layer of in-situ doped polysilicon (ISDP) 514. The space between the contacts is filled with insulating $SiO_2$.

A layer of polymer is disposed as the passivation layer 522 to protect the top layer 506.

Following sub-process 604 and 606, the top wafer 506 is wafer-wafer bonded to the device layer 504 and handling layer 500. The trench that was previously defined in the top layer 506 in sub-process 606 defines the cavity 508. The environment at the time of bonding controls the environment within the cavity. If the bonding is performed in a vacuum, the deflection of the membrane 106 is dependent solely upon the pressure exerted upon it by the environment below the membrane, and hence the pressure sensor 100 is an absolute pressure sensor.

As shown in FIG. 6, after formation of the three layer stack, the device 518 is coated with a protective layer 510, e.g., silicon nitride ($Si_3N_4$), prior to the post-processing steps depicted in FIG. 7. Referring to FIGS. 6, 7A, and 7B it can be seen that the initial structure, according to an embodiment of the invention, comprises a 90 μm top layer 506, a 30 μm device layer 504, and an approximately 275 μm handling layer 500.

The membrane 106 of the capacitor is formed during post-fabrication processes. The post-processing steps yield the device cross-sections depicted in FIGS. 7A and 7B. These steps comprise:

Etching the handling wafer 500 until reaching the silicon oxide layer 524 and subsequent etching to remove the oxide layer.

Etching of the device layer 504 to form the membrane 106.

Beneficially, the post-processing sequence does not require any alignment marks on the backside, thereby avoiding the requirement for a photolithography processes and there is no requirement for a hard etch mask for the deep reactive ion etching of the handling and device layers 500, 504 wherein approximately 232 μm of material is removed from the geometry. Accordingly, there are no requirements for any plasma enhanced chemical vapour deposition (PECVD) oxide/nitride deposition or low temperature oxide (LTO) deposition and its subsequent dry or wet etching. The process is suited to forming devices such as pressure sensors for a range of applications. Accordingly, the top side 520 of the device 518 is protected initially, for example, with thick PECVD silicon nitride, silicon oxide, or silicon oxynitride. There are a range of different process configurations to achieve the desired post-processing, including, for example, purely wet etching, purely dry etching, and combinations thereof. Exemplary processes for each of these are presented below.

Wet Etching: The first post-processing step is a wet etching process using potassium hydroxide (KOH) or tetramethylammonium hydroxide (TMAH) in order to etch down the handling wafer 500 until the oxide layer 524 deposited onto the handling wafer 500 within the trench is reached. Within the structure depicted in FIG. 6 this requires the removal of approximately 232 μm of silicon wafer. At this point, the oxide layer 524 is removed, for example, using a dry etching process with trifluoromethane (CHF3). Now the device layer 504 is etched using TMAH or KOH in order to create the thin membrane layer 106. As this etching is through bulk silicon, high reproducibility can be achieved.

Dry Etching. In this process, dry etching of the handling wafer 500 is initially performed until reaching the oxide layer 524, requiring removal of approximately 232 μm of silicon wafer for the structure depicted in FIG. 6. At this point, the oxide layer 524 is removed, for example, using a dry etching process with CHF3. Finally, deep etching of the device layer 504 with a special recipe DRIE process is undertaken to provide highly controlled etching in order to attain the desired precision and uniformity of the membrane thickness.

Dry and Wet Etching A: In this process, dry etching of the handling wafer 500 is initially performed until reaching the oxide layer 524, requiring removal of approximately 232 μm of silicon wafer for the structure depicted in FIG. 6. At this point, the oxide layer 524 is removed, for example, using a dry etching process with CHF3. Finally, the device layer 504 is etched using TMAH or KOH in order to create the thin membrane layer 106.

Dry and Wet Etching B: In this process, wet etching of the handling wafer 500, using KOH or TMAH, is initially performed until reaching the oxide layer 524, requiring removal of approximately 232 μm of silicon wafer for the structure depicted in FIG. 6. At this point, the oxide layer 524 is removed, for example, using a dry etching process with CHF3. Finally, deep etching of the device layer 504 with a special recipe DRIE process is undertaken to provide highly controlled etching in order to attain the desired precision and uniformity of the membrane thickness.

Referring to FIGS. 6, 7A, and 7B it can be seen that the initial structure, according to an embodiment of the invention, comprises a 90 μm top layer 506, a 30 μm device layer 504, and an approximately 275 μm handling layer 500. Post-fabrication processing has thinned the handling wafer 500 to approximately 30 μm whilst the device layer 504 has been thinned to form the circular membrane 106 that is approximately 5 μm thick. Thinning of the device layer 504 to a 5 μm thick membrane 106 reduces the stiffness, increasing the sensitivity of the membrane. Deflections of the membrane 106 change the capacitance between the membrane 106 and the top electrode 104.

It would be evident that the MEMS pressure sensor 100 described with respect to embodiments of the invention may be formed simultaneously/concurrently with other MEMS devices exploiting the same three layer design methodology of handling layer 500 (bottom layer), device layer 504, and top layer 506 (TSV layer). By the addition of a photolithography process prior to etching the opening within the handling wafer 500 through which the MEMS pressure sensors are formed then the handling wafer thickness over the remaining regions is maintained.

Accordingly, considering the process flow 600 described above in connection with FIG. 10, the resulting structure is a device layer 504 having active elements disposed between upper and lower cavities 508, 502 resulting from trenches formed within the top and handling layers 506, 500 respectively. The environment at the time of bonding these top, device, and handling layers 506, 504, 500 together allows the environment within the cavity or cavities to be controlled. In the instance the membrane 106 within the device layer 504 is as large as the trenches then two cavities are formed but in the instance that the membrane 106 is not then there is a single cavity with the membrane 106 (i.e. beam) disposed within. Accordingly, a resonator beam may be packaged within a hermetic very low pressure environment for a high quality factor or a cavity sealed at very low pressure on one side of the membrane 106 for an absolute pressure sensor.

It would be evident that formation of a beam resonator within a cavity and absolute pressure sensor may be made within the same device using the designs described supra wherein in the absolute pressure sensor the handling wafer 500 is processed to remove the silicon, opening the lower cavity 502 to ambient pressure, whereas in the resonator case the silicon is not removed.

Figure 12:
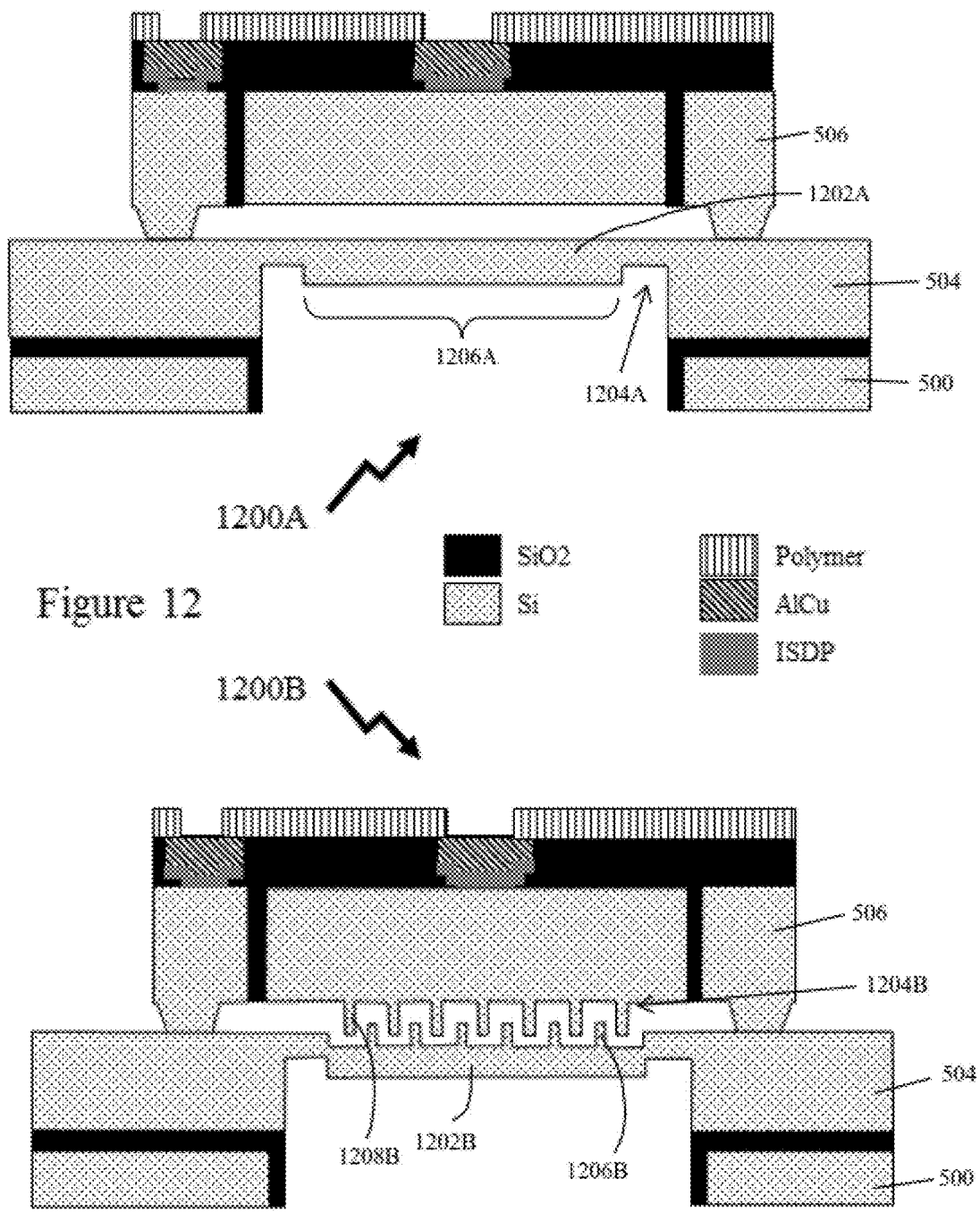
FIG. 12 depicts alternate membrane designs for MEMS pressure sensors according to embodiments of the invention.

Referring to first and second cross-sections 1200A and 1200B in FIG. 12 alternate membrane designs are depicted for pressure sensors according to embodiments of the invention. Referring to first cross-section 1200A then a "bossed" membrane 1202A as defined by the inventors is depicted wherein the membrane 1202A on the device layer 504 is formed by an annular ring 1204A of thin silicon with a thicker central "boss" region 1206A. In contrast, in second cross-section 1200B in FIG. 12 an "interdigitated" membrane 1202B within the device layer 504 and an "interdigitated" body 1204B within the top layer 506 increase the effective surface area wherein external pressure deforms the central "interdigitated" membrane 1202B within the device layer 504 through the annular thin "living hinge" such that the vertical "fingers" 1206B on the device layer 504 move relative to the "fingers" 1208B on the top layer 506.

A3.B CMOS Electronics Integration

Figure 11:
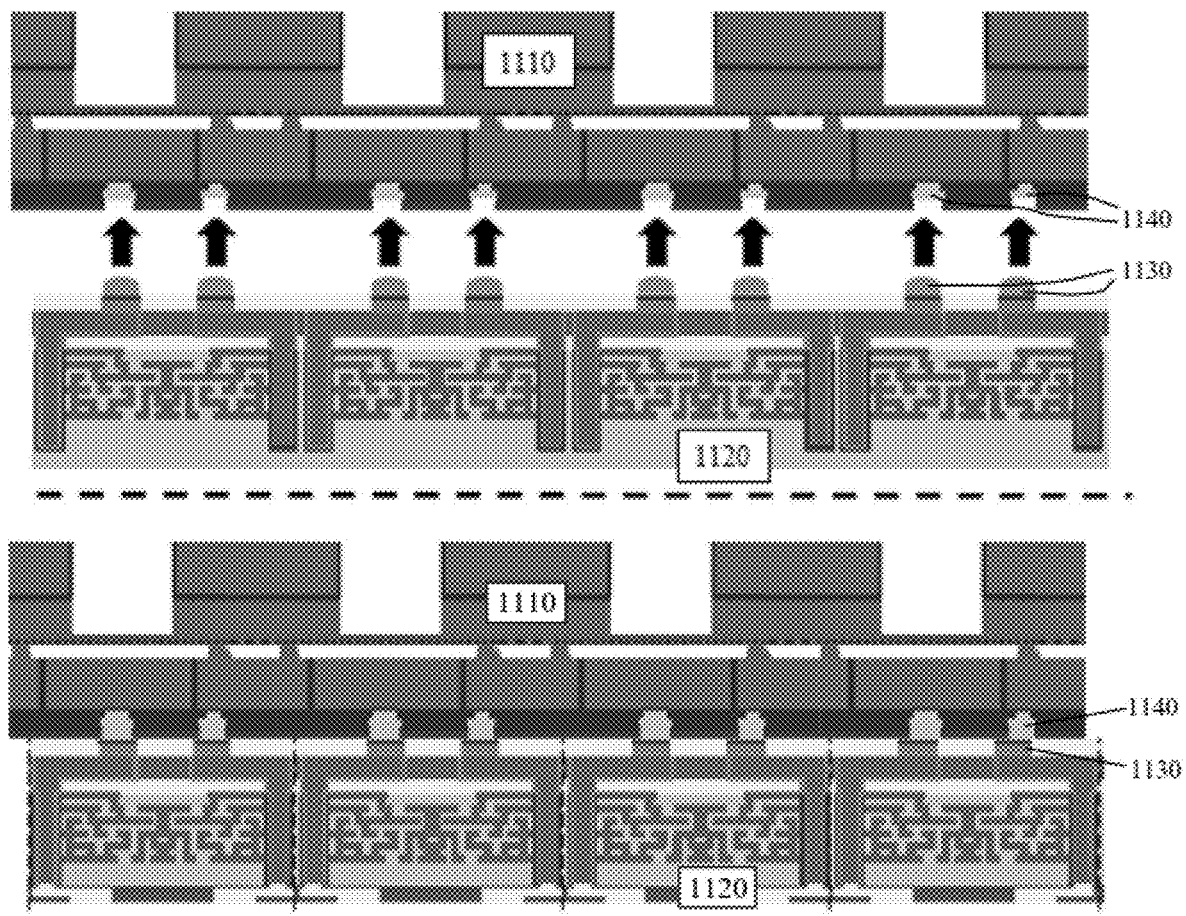
FIG. 11 depicts an exemplary integration methodology for MEMS pressure sensors according to an embodiment of the invention.

Referring to FIG. 11 there is depicted an exemplary integration methodology for MEMS pressure sensors according to an embodiment of the invention wherein a fabricated array/die/wafer of MEMS pressure sensors 1110 is flipped and aligned relative to a CMOS electronics 1120 die/wafer. These are then brought together under conditions that the contact bumps 1130, e.g. Au/Sn on the CMOS electronics 1120 die/wafer join to the metallization 1140 on the MEMS pressure sensors 1110, e.g. Au/Sn as well, to form a bond and electrical contact.

A4. Simulation and Results

Figure 8:
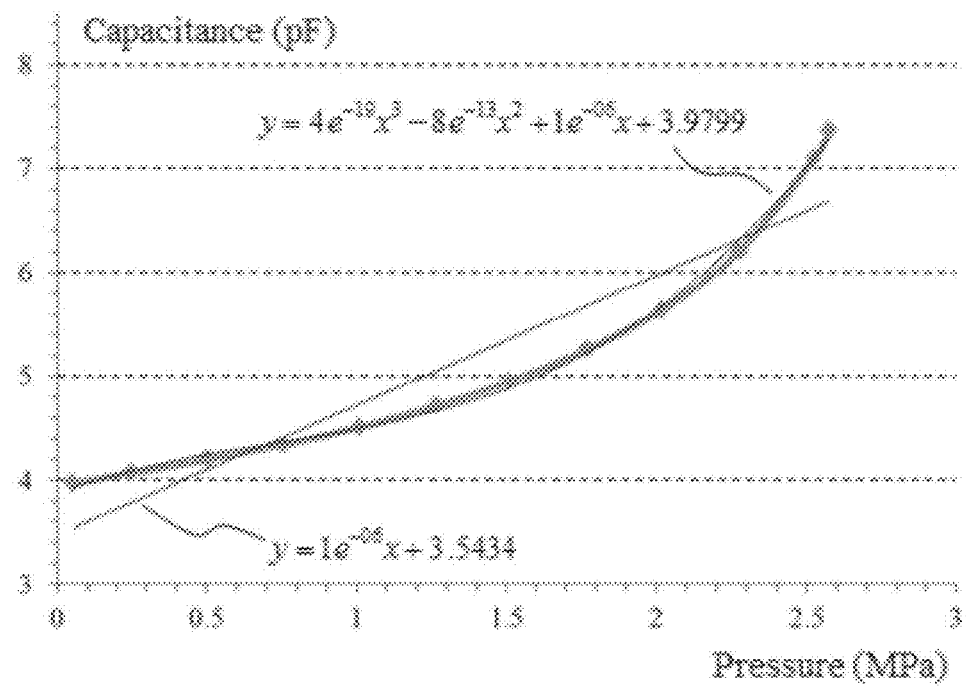
FIG. 8 depicts the calibration curve for a MEMS absolute pressure sensors according to an embodiment of the invention.

Referring to Table 1 there are listed the design parameters for a MEMS pressure sensor 100 fabricated according to an embodiment of the invention. The calibration curve derived for this MEMS sensor 100 is depicted in FIG. 8 over the range 0.05 MPa≤P≤2.50 MPa. In FIG. 9 with first to third images 900A to 900C there are depicted the results of electromechanical simulations on the MEMS pressure sensor 100. First image 900A depicts the fundamental mode of the membrane 106 whilst second and third images 900B and 900C respectively depict the first order modes of the membrane 106.

TABLE 1

Pressure Sensor Specification

| Parameter | Value |
|---|---|
| Gap (μm) | 2 |
| Radius (μm) | 180 |
| Thickness (μm) | 12 |
| Sensitivity (pF/kPa) | $4.96 \times 10^{-4}$ |
| Resolution (δC = 10 fF) kPa | 20.2 |
| Equivalent Mass $m_{eff}$ (kg) | $1.40 \times 10^{-9}$ |
| Equivalent Spring Constant | 47100 |
| Damping Coefficient $b_{eff}$ (N/m) | $1.13 \times 10^{-2}$ |
| Natural Frequency (kHz) | 922.920 |

Beneficially, embodiments of the invention provide a fabrication process which is designed to be fully compatible with monolithic integration above CMOS electronics, and other electronics technologies that can withstand the low processing temperatures of embodiments of the invention. Beneficially this provides:

- direct integration over the electronics;
- improved system performance through reduced parasitic effects;
- reduced die size;
- increased electronics selection freedom, allowing for use of high performance technological nodes
- reduced package footprint and thickness;
- self-aligned processing;
- lower sensor fabrication costs through batch processing;
- integral reference elements; and
- integral heaters and/or temperature stabilization.

Referring to FIG. 2 it would be evident that in the die 202 depicted nine pressure sensors 100 are concurrently fabricated. Optionally, a first subset of the elements may be processed with membranes, i.e. forming pressure sensors, and a second subset of the elements may be processed without membranes such that they form reference pressure elements. Optionally, the process flows 602, 604, 606 described and depicted may be modified to provide for two or more membrane thicknesses such that a plurality of pressure sensors with different pressure ranges are concurrently formed from the process flow(s). As the capacitance of capacitors in parallel is directly additive the interconnection of a group of pressure sensor may be implemented within the MEMS die directly.

The foregoing disclosure of the exemplary embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of step. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A method for post-fabrication of a MEMS device, the method comprising:
   providing the MEMS device comprising (i) a handling layer, (ii) a top layer, and (iii) a device layer located between the handling layer and the top layer, wherein the handling layer comprises a first trench on a top face of the handling layer adjacent to the device layer, wherein the top layer comprises a second trench on a bottom face of the top layer adjacent to the device layer, the second trench facing the first trench, wherein a first portion of the top layer is electrically insulated from a second portion of the top layer, wherein the first portion of the top layer extends to the second trench, wherein the device layer comprises a section of silicon positioned between the first trench and the second trench;
etching a back face of the handling layer until reaching the first trench, thereby forming an opening extending through the handling layer; and
etching the section of silicon of the device layer through the opening in the handling layer, thereby thinning the section of silicon of the device layer to form a flexible membrane that is (i) positioned between the opening and the second trench and (ii) capacitively coupled with the first portion of the top layer.

2. The method of claim 1, wherein etching the section of silicon of the device layer comprises dry etching the section of silicon of the device layer or wet etching the section of silicon of the device layer.

3. The method of claim 1, wherein etching the back face of the handling layer comprises wet etching the back face of the handling layer or dry etching the back face of the handling layer.

4. The method of claim 1, wherein the second trench is at a vacuum pressure.

5. The method of claim 2, wherein the MEMS device further comprises an insulating layer deposited on the top face of the handling layer adjacent to the device layer, and wherein forming the opening further comprises etching through the insulating layer.

6. The method of claim 1, further comprising securing a CMOS electronics wafer to a top face of the top layer opposite the bottom face of the top layer.

7. The method of claim 1, wherein thinning the section of silicon of the device layer to form the flexible membrane comprises (i) etching a central portion of the section of silicon of the device layer to a first thickness and (ii) etching an outer portion of the section of silicon of the device layer to a second thickness that is thinner than the first thickness.

8. The method of claim 1, wherein etching the section of silicon of the device layer through the opening in the handling layer comprises deep reactive-ion etching the section of silicon of the device layer.

9. The method of claim 1, wherein providing the MEMS device comprises (i) forming the first trench on the top face of the handling layer and (ii) bonding the device layer to the handling layer.

10. The method of claim 9, wherein providing the MEMS device further comprises (i) forming the second trench on the bottom face of the top layer and (ii) bonding the top layer to the device layer.

11. The method of claim 10, wherein the top layer is bonded to the device layer while under a vacuum pressure.

12. The method of claim 10, wherein the device layer comprises a first plurality of fingers protruding toward the top layer into the second trench, wherein the top layer comprises a second plurality of fingers protruding toward the device layer into the second trench, and wherein bonding the top layer to the device layer comprises bonding the top layer to the device layer such that the first plurality of fingers and the second plurality of fingers are interdigitated.

13. The method of claim 10, wherein bonding the top layer to the device layer comprises bonding the second portion of the top layer to the device layer.

14. The method of claim 9, wherein the top layer further comprises an annulus with finite thickness that insulates the first portion of the top layer from the second portion of the top layer.

15. The method of claim 14, wherein the first portion of the top layer is electrically connected to a first electrode of the MEMS device, wherein the second portion of the top layer is electrically connected to a second electrode of the MEMS device.

16. The method of claim 14, further comprising forming a first electrical contact on the first portion of the top layer and a second electrical contact on the second portion of the top layer.

17. The method of claim 16, further comprising bonding the first electrical contact and the second electrical contact to a CMOS circuit.

* * * * *